(12) United States Patent
Kuramachi et al.

(10) Patent No.: US 7,369,586 B2
(45) Date of Patent: May 6, 2008

(54) LASER MODULE

(75) Inventors: Teruhiko Kuramachi, Kanagawa-ken (JP); Fusao Yamanaka, Kanagawa-ken (JP); Kazuhiko Nagano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 415 days.

(21) Appl. No.: 10/954,245

(22) Filed: Oct. 1, 2004

(65) Prior Publication Data

US 2005/0074039 A1    Apr. 7, 2005

(30) Foreign Application Priority Data

Oct. 2, 2003    (JP)    ............... 2003-344502

(51) Int. Cl.
*H01S 3/13*    (2006.01)
(52) U.S. Cl. ..................... 372/29.02; 372/34
(58) Field of Classification Search ............. 372/29.02
See application file for complete search history.

(56) References Cited

U.S. PATENT DOCUMENTS

| 5,392,305 | A | 2/1995 | Jakobson |
| 6,404,786 | B1 | 6/2002 | Kondo et al. |
| 6,847,660 | B2* | 1/2005 | Morikawa et al. ............. 372/5 |
| 2002/0090172 | A1 | 7/2002 | Okazaki et al. |
| 2003/0214987 | A1* | 11/2003 | Yamanaka et al. ............ 372/43 |

FOREIGN PATENT DOCUMENTS

JP    11-87814 A    3/1999

* cited by examiner

*Primary Examiner*—Minsun Oh Harvey
*Assistant Examiner*—Tod T. Van Roy
(74) *Attorney, Agent, or Firm*—Sughrue Mion, PLLC

(57) ABSTRACT

In a laser module comprising a hermetically sealed container having inside a semiconductor laser device whose emission wavelength is 350–450 nm, generation of organic volatile gas is suppressed in the container and life of the module is prolonged. In a laser module comprising a hermetically sealed container having inside a semiconductor laser device whose emission wavelength is 350–450 nm, optical components whose organic volatile gas generation measured by GC/MS is 10 μg/g or less at 150° C. are positioned in the container. In addition, as an organic adhesive to fix the optical components such as a collimating lens is used an organic adhesive whose organic volatile gas generation measured by GC/MS is 100 μg/g or less at 150° C.

14 Claims, 5 Drawing Sheets

LASER MODULE

BACKGROUND OF THE INVENTION

1. Field of the Invention

The present invention relates to a laser module comprising a semiconductor laser device enclosed in a hermetically sealed container.

2. Description of the Related Art

A laser module has been known comprising a semiconductor laser device, a collimating lens, a focusing lens, and an optical fiber positioned in a hermetically sealed container. In a laser module of this kind, a residual contaminant in a container adheres to optical components such as a laser end facet from which a laser light is emitted, a lens, and an optical fiber, resulting in deterioration of a characteristic of the laser module. As an example of such a contaminant, hydrocarbon compounds originating from an atmosphere in a manufacturing process can be listed. The hydrocarbon compounds are polymerized or decomposed by a laser light and deposited.

In order to solve this problem, various methods have been proposed as explained below. For example, U.S. Pat. No. 6,404,786 states that reduction in an amount of total hydrocarbon compounds in a container to 0.1% or lower is effective for preventing a decrease in the power of laser light whose wavelength is 400 nm or shorter. In this manner, deposition of hydrocarbon compounds on optical components or the like caused by photodecomposition of the hydrocarbons can be prevented. Furthermore, using a dry air as a sealed atmosphere has also been proposed, in expectation of removal of deposited hydrocarbons by photochemical reaction with oxygen in the sealed atmosphere.

Moreover, in U.S. Pat. No. 5,392,305, introduction of 100 ppm or more oxygen into a gas to be sealed in a container is described for decomposing an organic gas such as hydrocarbons, thereby adhesion of a contaminant to a laser end facet caused by photo-decomposition of the organic gas can be prevented.

In addition, Japanese Unexamined Patent Publication No. 11(1999)-87814 states that long-term reliability of a laser module can be assured by removing a contaminant such as oil in the module through defatting and cleaning thereof.

In U.S. Patent Laid-Open No. 20020090172, a laser module has been proposed, using a GaN semiconductor laser device whose emission wavelength is 350~450 nm. In a laser module of this kind, a laser light of such short wavelength has high energy. Therefore, the probability is high that a material generated by polymerization or decomposition of hydrocarbons in the module adheres to a laser end facet and other optical components, which is especially problematic.

A hydrocarbon deposit generated by reaction of hydrocarbons with a laser light can be decomposed into $CO_2$ and $H_2O$ in a gaseous atmosphere including a certain amount of oxygen, as has been described in U.S. Pat. No. 5,392,305. Therefore, the problem caused by the hydrocarbon deposit can be solved.

However, presence of silicon compounds is confirmed in such a deposit, in addition to the hydrocarbons, and it has been known that inclusion of oxygen in a laser atmosphere cannot decompose and remove the silicon compounds. A deposit comprising hydrocarbons and silicon compounds absorbs a laser light, which seriously damages temporal reliability of a laser module in continuous emission. Such silicon compounds are generated by photochemical reaction between a laser light and a gas of organic compounds including Si (hereinafter referred to as an organic silicon compound) such as a compound including the siloxane bond (Si—O—Si) and a silanol (—Si—OH) group. In addition, presence of oxygen in an atmosphere increases a speed of the reaction. The silicon compounds refer to organic or inorganic compounds having a structure including silicon. Therefore, inorganic $SiO_x$ and an organic silicon compound are included therein.

A source of the silicon compounds is mainly a gas generated from a silicone material used in a fabricating process of a laser module. The gas is present on the surface of components of the laser module in some cases, and a tiny amount of the gas is included in a sealed atmosphere in the case where the laser module is sealed. Complete removal of the gas component in the fabricating process cannot be realized by usage of an ordinary clean room or installation of a sealed-gas purifier. Therefore, a large amount of investment becomes necessary for managing the gas component. In addition, introduction of such a compound from an atmosphere in a fabricating process cannot be prevented in a defatting or cleaning process of oil disclosed in Japanese Unexamined Patent Publication No. 11(1999)-87814. Since a liquid organic substance is used in the cleaning process, management of impurities in a drying process is necessary. Furthermore, a cleaning agent needs to be selected that cannot dissolve an adhesive used for fixing a semiconductor laser device and an optical component. However, the characteristic of not dissolving an adhesive is in many cases contradictory to maintaining an ability to clean off the organic substance sticking to the component and the like.

The hydrocarbon compounds and the silicon compounds adhering to components in a laser module can be removed by devolatilization thereof through heating at a temperature of 200° C. or more, preferably at 300° C. or more. However, the heating takes several hours to several tens of hours. In addition, in the case where components in a module are fixed by an organic adhesive, thermal degradation of the adhesive leads to degradation of a mechanical characteristic thereof. Therefore, this method cannot be used.

Moreover, it is known that the method of introducing 100 ppm or more oxygen into a sealed gas, as has been described in U.S. Pat. No. 5,392,305, is not effective for a laser module having a semiconductor laser device whose emission wavelength is as short as 350~450 nm. More specifically, in such a short-wavelength semiconductor laser device, dependency of a speed of temporal degradation on an oxygen concentration in an atmosphere becomes different from the case of a semiconductor laser device whose emission wavelength is in an infrared range. Therefore, no improvement is observed in association with an increase in oxygen concentration. In other words, in the case of a semiconductor laser device whose emission wavelength is in an infrared range, decomposition of an organic compound having hydrocarbons deposited on the surface of optical components along a laser light path, such as a laser end facet, optical components, and a fiber end in a module, can be facilitated by an increase in oxygen concentration, which leads to improvement in temporal reliability. On the other hand, in the case of a short-wavelength semiconductor laser device, reliability becomes lower when the oxygen concentration is 100 ppm. Deposition of silicon compounds, which becomes evident in 100 ppm or more oxygen concentration, is thought to cause this phenomenon. Although sealing oxygen up to a certain amount is usually necessary in order to prevent deposition of hydrocarbon compounds, deterioration of reliability of a system for emitting a laser light in an atmosphere including a large amount of hydrocarbon gas cannot be prevented, due to an increase in silicon compound deposit.

SUMMARY OF THE INVENTION

The present invention has been conceived based on consideration of the above circumstances. An object of the present invention is therefore to prolong life of a laser module comprising a hermetically sealed container containing a semiconductor laser device whose emission wavelength is 350~450 nm, by suppressing generation of an organic volatile gas in the container.

A laser module of the present invention is a laser module having a hermetically sealed container containing a semiconductor laser device whose emission wavelength is 350~450 nm. The laser module of the present invention is characterized by that an amount of organic volatile gas generated from each of optical components including the semiconductor laser device in the container is 10 μg/g (a total amount [μg] of volatile organic substances per an amount of a volatile gas of hexadecane) or less when examined by GC/MS (Gas Chromatography/Mass Spectrometry) at 150° C., and an amount of organic volatile gas generated from an organic adhesive used for fixing the optical components in the container is 100 μg/g or less when examined by GC/MS at 150° C.

The present invention is preferably applied to a laser module whose optical components include an optical fiber and an optical system for inputting a laser light emitted from the semiconductor laser device to the optical fiber.

As the organic adhesive can be used an organic adhesive containing an adhesive composition including an alicyclic epoxy compound having an epoxy group, a compound having an oxetanyl group, and a catalyst quantity of an onium salt photo-initiator.

It is preferable for the adhesive composition to be inserted between the optical components and a fixture to fix the optical components thereon, in a thickness ranging from 0.05 μm to 5 μm, and to be cured by an activation light in order to fix the optical components on the fixture.

It is also preferable for the adhesive composition to include a silane coupling agent or spherical silica particles whose average diameter ranges from 0.1 μm to 1.0 μm.

The fixture is preferably composed of a metal while the optical components are preferably composed of an inorganic transparent material.

It is preferable for the compound including an oxetanyl group to be expressed by the following Formula (1):

(1)

In Formula (1), $R_1$ represents a methyl group or an ethyl group while $R_2$ represents a hydrocarbon group including 6~12 carbon atoms.

The adhesive composition preferably used in the present invention is described in Japanese Unexamined Patent Publication No. 2001-177166, which is also explained below in detail.

The adhesive composition necessarily includes an alicyclic epoxy compound having an epoxy group, a compound having an oxetanyl group, and a catalyst quantity of an onium salt photo-initiator. Each of the compounds and the photo-initiator may comprise only one type of chemical or mixture of two or more chemicals.

An epoxy compound having two or more intramolecular epoxy groups can be used in the present invention. It is preferable for the epoxy compound to contain an alicyclic epoxy compound having two or more intramolecular epoxy groups rather than a glycidyl compound having two or more intramolecular epoxy groups but not having an alicyclic structure. The alicyclic epoxy compound having two or more epoxy groups refers to a compound whose molecule includes two or more partial structures generated by epoxidation of a double bond in a cycloalkene ring such as a cyclopentene group and a cyclohexene group by using an appropriate oxidizing agent such as hydrogen peroxide or peroxy acid. As the alicyclic epoxy compound having an epoxy group, a compound whose molecule includes two or more cyclohexene oxide groups or cyclopentene oxide groups is preferably used in the present invention. As an example of the alicyclic epoxy compound are listed 4-vinylcyclohexene dioxide, (3,4-epoxycyclohexyl)methyl-3,4-epoxycyclohexyl carboxylate, di(3,4-epoxycyclohexyl)adipate, di(3,4-epoxycyclohexylmethyl)adipate, bis(2,3-epoxycyclopentyl)ether, di(2,3-epoxy-6-methylcyclohexylmethyl)adipate, and dicyclopentadiene dioxide. Each of the alicyclic epoxy compounds described above may be used solely. Alternatively, mixture thereof may be used. Various kinds of alicyclic epoxy compounds are available on the market, and can be obtained from UNION CARBIDE JAPAN KK and DAICEL CHEMICAL INDUSTRIES, LTD., for example.

Furthermore, a glycidyl compound having two or more intramolecular epoxy groups but not having an alicyclic structure may also be used approximately up to the same weight of the alicyclic epoxy compound. A glycidyl ether compound or a glycidyl ester compound can be listed as the glycidyl compound. However, using together a glycidyl ether compound is preferable. As an example of the glycidyl ether compound can be listed an aromatic glycidyl ether compound such as 1,3-bis(2,3-epoxypropyloxy)benzene, a bisphenol A type epoxy resin, a bisphenol F type epoxy resin, a phenol-novolac type epoxy resin, a cresol-novolac type epoxy resin, and a trisphenol methane type epoxy resin. Furthermore, an aliphatic glycidyl ether compound such as 1,4-butanediol glycidyl ether, glycerol triglycidyl ether, propylene glycol diglycidyl ether, and trimethylol propane tri triglycidyl ether can also be listed as an example of the glycidyl ether compound. As the glycidyl ester, a glycidyl ester of linolenic acid dimer can be used. The glycidyl compound to be used together with the alicyclic epoxy compound may contain only one of the compounds described above or mixture thereof. The glycidyl ether compound can be obtained from Japan Epoxy Resins Co., Ltd.

The compound having an oxetanyl group (also referred to as an oxetane compound hereinafter) is a compound having at least one oxetanyl group in a molecule thereof. Compounds having an oxetanyl group are largely classified into compounds having one intramolecular oxetanyl group and compounds having two or more intramolecular oxetanyl groups.

As the mono-functional oxetane compound having one intramolecular oxetanyl group used in the present invention is preferably expressed by Formula (1) below:

(1)

In Formula (1, $R_1$ represents a methyl or an ethyl group while $R_2$ represents a hydrocarbon group having 6 and 12 carbons. The hydrocarbon group represented by $R_2$ may be a phenyl or benzyl group. However, an alkyl group having 6 to 8 carbons is preferable. A branched alkyl group such as 2-ethylhexyl group is especially preferable. An example of the oxetane compound having a phenyl group as $R_2$ is described in Japanese Unexamined Patent Publication No. Hei 11(1999)-140279. Japanese Unexamined Patent Publication No. Hei 6(1994)-16804 describes an example of the oxetane compound having a benzyl group as $R_2$ that may be substituted. An oxetane compound having an ethyl group as $R_1$ and a 2-ethylhexyl group as $R_2$ is preferably used in the present invention as a diluent, a curing accelerator, a flexibilizing agent, and an agent for surface tension reduction, all of which have excellent performance.

The multi-function oxetane compound having two or more intramolecular oxetanyl groups can also be used for the present invention. A compound preferable for the present invention is expressed by the following Formula (2):

(2)

In Formula (2), m is a natural number from 2 to 4, and Z represents an oxygen atom, a sulfur atom, or a Selenium atom. $R_3$ represents a hydrogen atom, a fluorine atom, or a straight-chain or branched alkyl group having 1 to 6 carbon atoms. Alternatively, $R_3$ may also represent a fluoroalkyl group, an allyl group, a phenyl group, or a furyl group, each of which has 1 to 6 carbon atoms. $R_4$ represents a combining group whose value is m, and preferably a group having 1 to 20 carbon atoms. $R_4$ may include 1 or more oxygen or sulfur atoms. It is preferable for Z to be an oxygen atom, while an ethyl group is preferable for $R_3$. It is also preferable for m to be 2. A linear or branched alkylene group having 1 to 16 carbon atoms or a linear or branched poly(alkyleneoxy) group is preferably used for $R_4$. A compound having any combination of two or more of the above-described preferable examples of $R_3$, $R_4$, Z and m is more preferable.

The onium salt photo-initiator used in the present invention refers to an onium salt that is thought to generate active chemical species by irradiation of an activation light on the adhesive composition. It is preferable for the onium salt photo-initiator to be an aromatic iodonium salt or an aromatic sulfonium salt because of comparative thermal stability thereof. The activation light refers to a light for generating chemically active species (cationic species such as Lewis acid and Broensted acid) that can initiate chemical reaction, by being irradiated on the onium salt. The activation light includes an ultraviolet ray, an electron beam, a Gamma ray, and an X ray, for example. However, an ultraviolet ray is preferably used.

In the case where an aromatic sulfonium salt and an aromatic iodonium salt are used as the onium salt photo-initiator, $BF_4^-$, $AsF_6^-$, $SbF_6^-$, $PF_6^-$, and $B(C_6F_5)_4^-$ are listed as pairing anions. As the initiator, a $PF_6$ salt or $SbF_6$ salt of aromatic sulfonium can be used preferably because of resolvability and an appropriate polymerization activity thereof. In order to improve resolvability, a chemical structure is preferred wherein one or more alkyl groups or alkoxy groups having 1 to 10 carbon atoms are introduced to an aromatic group in an aromatic iodonium salt or an aromatic sulfonium salt, usually to a phenyl group. A $PF_6$ salt or $SbF_6$ salt of aromatic sulfonium salt can be obtianed from UNION CARBIDE JAPAN KK, for example. ASAHI DENKA CO,. LTD. also provides $PF_6$ salts of aromatic to 320 nm, respectively. Therefore, an ultraviolet ray having spectroscopic energy in this range is irradiated for curing.

Sulfonium salts PI-3 and PI-4 in the following structural formulas show high efficiency of light absorption, and are used preferably.

PI-1

PI-2

PI-3 mixture

PI-4 mixture

The onium salt photo-initiator used in the present invention is thought to cure the adhesive composition of the present invention by cation polymerization of the alicyclic epoxy compound and the compound having an oxetanyl group through generation of active cation species in response to irradiation of the activation light.

A weight ratio of the alicyclic epoxy compound to the oxetane compound in the adhesive composition of the present invention is (95~65) parts by weight per (5~35) parts. Preferably, the ratio is (80~70) parts per (20~30) parts. If addition of the mono-functional oxetane compound is not sufficient, a liquid characteristic such as viscosity and surface tension of the adhesive composition is not preferable. On the contrary, if the oxetane compound is added excessively, the cured material becomes too soft, which leads to reduction in adhesion strength. Only a catalyst quantity of the onium salt photo-initiator is used, and an amount of addition thereof is 0.3~10 parts by weight per 100 parts of the combination of the alicyclic epoxy compound and the oxetane compound. A preferable range thereof is 0.5~5 parts by weight.

The adhesive composition described above is preferably inserted between the optical components and the fixture in a thickness ranging from 0.05 µm to 5 µm. If the thickness is smaller than this range, adhesion strength of the adhesion composition is not sufficient. On the other hand, if the thickness exceeds this range, a deleterious effect of curing contraction tends to be observed on the adhesive. A preferable thickness ranges from 0.05 µm to 2 µm, and an especially preferable thickness is from 0.2 µm to 1 µm.

In the present invention, addition of a silane coupling agent to the adhesive composition is preferable. A silane coupling agent is thought to chemically bond the adhesive composition to the optical components and to an inorganic fixture and a metal fixture used for fixing the components thereon. By using together a silane coupling agent, adhesion strength and durability of adhesion can be improved. As a silane coupling agent to be used in the present invention, an epoxy silane class having an intramolecular epoxy group and an intramolecular trimethoxy silyl group is preferably used. The coupling agent of this kind is sold by Shin-Etsu Chemical Co., Ltd. under product numbers such as KBM303, KBM403, and KBE402. A preferable range of usage of the silane coupling agent is 0.5~5 parts by weight per 100 parts of the combination of the alicyclic epoxy compound and the oxetane compound. More preferably, 1~3 parts by weight is used.

In the present invention, it is preferable for the adhesive composition to include spherical silica particles. The silica particles preferably have a diameter of 0.1~2 µm and as uniform grain size distribution as possible. Silica particles whose average grain size ranges from 0.2 µm to 0.8 µm are preferably used in the present invention. Especially, silica particles whose shape is close to complete sphere and having small ionic impurities are preferably used in the present invention. By adding the silica particles, thermal durability of the cured adhesive composition can be improved. An amount of addition of the spherical silica particles can be selected appropriately from a range of 1~20 parts by weight per 100 parts of the adhesive composition. Synthetic quartz spherical silica can be obtained from Tatsumori Ltd., for example.

In the present invention, the adhesive composition is preferably used for adhesion of inorganic transparent parts such as a lens and a reflection mirror to the fixture such as a holder made of a metal (cupper, cupper alloy, and aluminum, for example).

Through keen examination by the applicant, viscosity of the adhesive composition at room temperature (25° C.) is found to be preferable when adjusted in a range from 10 mPa·s to 1000 mPa·s. More preferably, the viscosity is adjusted in a range from 80 mPa·s to 300 mPa·s. In addition, a contact angle between the adhesive composition and the material to be fixed by the adhesive is found to be preferable when adjusted to be 40 degrees or smaller. More preferably, the angle is adjusted to be 30 degrees or smaller for favorable fixing. In order to adjust viscosity of the composition, addition of the mono-functional oxetane compound is effective. In addition, the contact angle can be adjusted by adding a fluorochemical surfactant upon necessity. Fluorochemical surfactants are surfactants having a fluorocarbon as a hydrophobic group, and classified into anionic, cationic, and nonionic surfactants. A nonionic surfactant of fluoroalkyl ester type is preferable for the present invention. An amount of addition of the nonionic surfactant is 0.1~1 parts by weight per 100 parts of the adhesive composition. The nonionic surfactant is available on the market under the trade name Fluorad™ (FC170C, FC171, FC430, and FC431, for example) manufactured by SUMITOMO 3M Limited.

In addition to the compounds described above, inerts such as dye and pigment can be added upon necessity to the adhesive composition used in the present invention. Furthermore, in order to improve photo-curability, a photosensitizer such as pyrene, perylene, acridine orange, thioxanthone, 2-chloro thioxanthone, and benzopyran may also be added. As a source of ultraviolet ray used for curing, various kinds of light sources can be used. For example, a mercury arc lamp, a xenon arc lamp, a carbon arc lamp, and a tungsten-halogen reprographic lamp can be listed.

GC/MS is one of methods having the highest analytical ability among organic volatile gas analysis methods that are currently available. The applicant measured an amount of organic volatile gas generated from various module components in a general operating environment (20~35° C.) of a laser module. According to this measurement, even if a value measured for an optical component is lower than 10 µg/g which is a general measurement limit and the component is thus judged to generate an extremely small amount of organic volatile gas, it is found in some cases that a laser module using the component cannot achieve expected life desired for general use of laser module.

Figure 5:
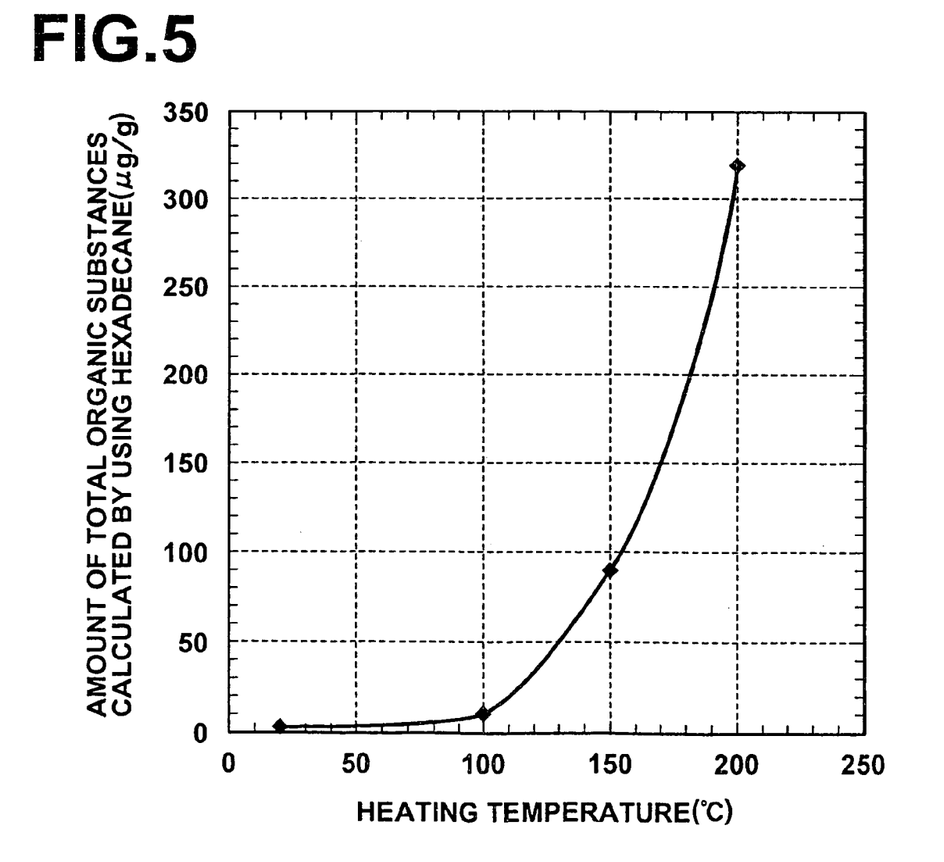
FIG. 5 is a graph showing a relationship between temperature of a laser module and an amount of generated organic volatile substances.

FIG. 5 shows a relationship between temperature and an amount of generated organic volatile gas when an organic adhesive having been subjected to deairing processing is examined by GC/MS. In the deairing processing, a measurement result according to GC/MS at room temperature becomes the measurement limit. As shown by FIG. 5, it is qualitatively known that the amount of organic volatile gas increases as the temperature rises. Decomposition and deterioration of an organic substance such as the organic adhesive starts when the temperature rises to approximately 100° C. or more, generating an organic volatile gas. Therefore, the applicant of the present invention infers that an organic volatile gas generated in this manner affects life of a semiconductor laser device. Consequently, the applicant examines a relationship between an amount of generated organic volatile gas and reduction in life of a semiconductor laser device at 150° C. which is higher than 100° C. At this temperature, an organic volatile gas is apparently generated but an adhesive or the like is not completely decomposed.

Figure 6:
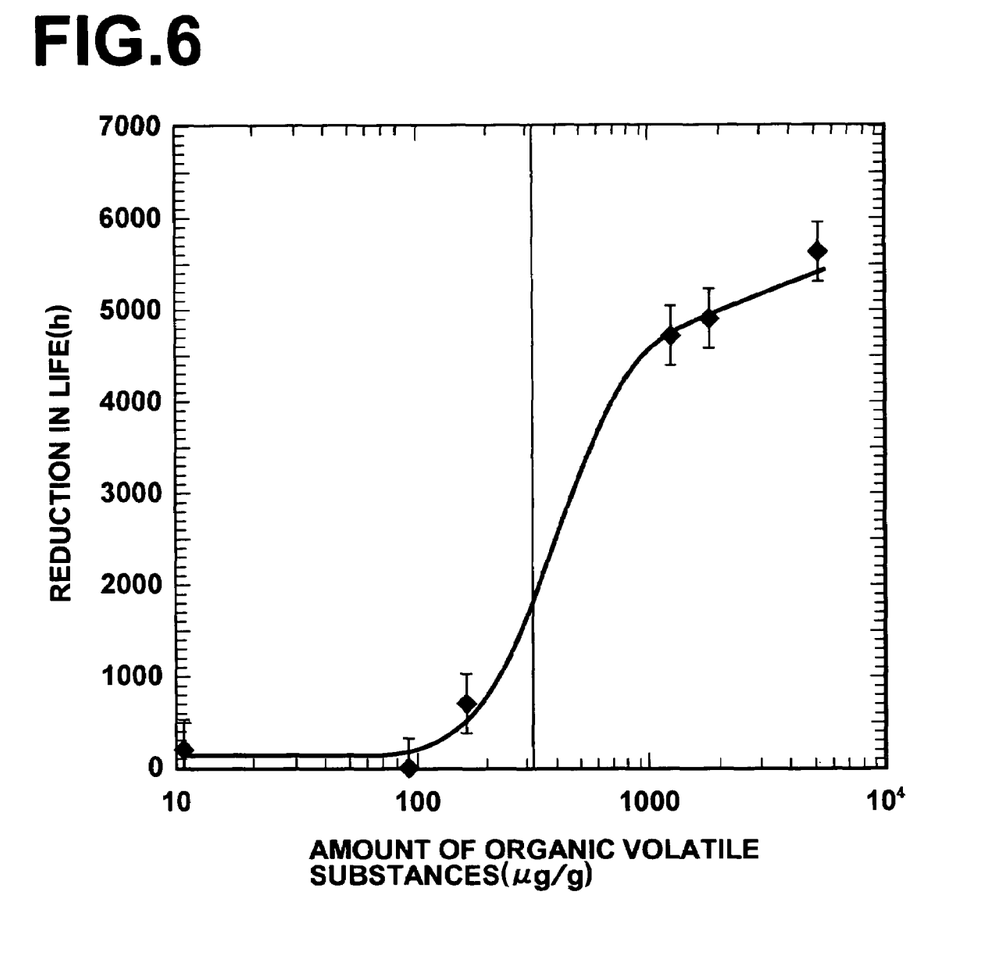
FIG. 6 is a graph showing a relationship between an amount of organic volatile gas generated from an organic adhesive measured by GC/MS and reduction in life of a semiconductor laser device.

As a result, a conspicuous correlation is found between the amount of organic volatile gas and the reduction in life of semiconductor laser device at 150° C. FIG. 6 shows the relationship. FIG. 6 shows an example of laser modules each comprising a semiconductor laser device having 405 nm emission wavelength and hermetically sealed in a cylindrical can-type container whose volume is 67.5 mm³. Optical components in the respective containers are cemented in the corresponding containers by 6 organic adhesives that generate different amounts of organic volatile gas measured at 150° C. by GC/MS. In each of the laser modules, an amount of organic volatile gas generation from each of the components laid out in the corresponding can-type container is 10 µg/g or less at 150° C. when measured by GC/MS. The can-type containers are hermetically sealed by using a dry air having 99.99% purity, after the components are positioned.

The vertical axis of FIG. 6 represents the reduction in life. The reduction can be calculated by subtraction of actual life (in hours) of each of the laser modules from estimated life (in hours) of the semiconductor laser devices themselves comprising the respective laser modules. In other words, the time represented by the vertical axis is the reduction in life of the semiconductor laser devices wastefully caused by the organic volatile gas generated in each of the containers. The estimated life of the semiconductor laser devices is defined to be a period in which the semiconductor laser devices can continuously emit a light at a probability of 95% or more. In the case where the can-type containers are hermetically sealed by using $N_2$ gas of 99.9999% purity instead of the dry air of 99.99% purity, a result of the examination is basically the same.

As shown in FIG. 6, the reduction in life of semiconductor laser devices caused by the organic volatile gas decreases substantially if the amount of organic volatile gas generation measured by GC/MS at 150° C. is 100 μg/g. In consideration of this new fact, the present invention uses the organic adhesive whose organic volatile gas generation measured by GC/MS at 150° C. is 100 μg/g or less, for fixing the optical components in the hermetically sealed container. In this manner, reduction in life of semiconductor laser device can be suppressed to be extremely small and life of the laser module can be prolonged.

In the laser module of the present invention, the amount of organic volatile gas generated from each of the optical components is 10 μg/g or less at 150° C. when measured by GC/MS. Therefore, the amount of organic volatile gas generated from each of the optical components in an operating environment (25~30° C.) is also 10 μg/g or less. Consequently, the life of the laser module is not shortened by the organic volatile gas generated from the optical components.

In a laser module whose optical components in a container includes an optical fiber and an optical system for inputting a laser light emitted from a semiconductor laser device to the optical fiber, a contaminant tends to accumulate on an entrance end of the optical fiber. Therefore, application of the present invention to such a laser module is especially effective.

If the organic adhesive comprising the adhesive composition described above is used for fixing the optical components on the fixture in the present invention, a contraction rate (linear contraction rate) caused by curing of the adhesive can be suppressed to around 2%. Therefore, in the case where the optical components of the laser module, such as a semiconductor laser device, a collimating lens, a focusing lens, and an optical fiber, are cemented on the fixture by the adhesive composition described above, if a layer thickness of the adhesive composition is adjusted to be 5 μm or less, contraction of the adhesive composition becomes 5×0.02=0.1 μm after a possible contraction of a part of the adhesive composition that has not been cured. Therefore, the contraction can be suppressed to be extremely small. Furthermore, the adhesive composition can uniformly spread between the optical components and the fixture even if a gap between the components and the fixture is as small as 1 μm. In addition, the adhesive composition can generate a strong and flexible cured material after being cured by an ultraviolet ray. Therefore, the adhesive composition described above can realize adhesion without separation in a wide temperature range from high (70° C.) to low (−25° C.). Consequently, accuracy of relative positions of the optical components can be maintained high, and thus reliability of the laser module using the adhesive composition is also high.

DESCRIPTION OF THE PREFERRED EMBODIMENT

Hereinafter, a preferred embodiment of the present invention will be explained in detail, with reference to FIGS. 1 to 4.

Figure 1:
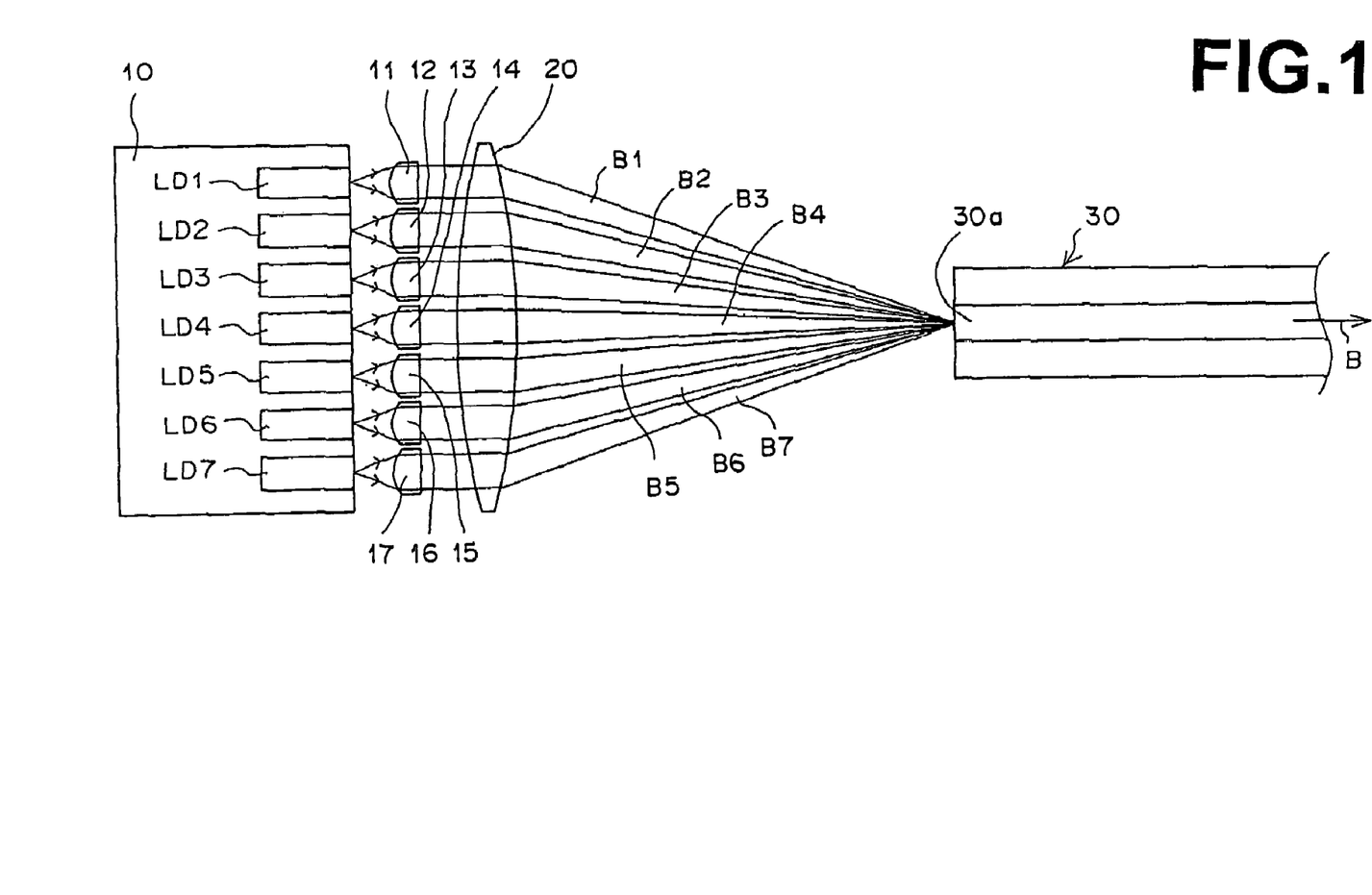
FIG. 1 shows an outline structure of a main part of a laser module according to an embodiment of the present invention.
Figure 2:
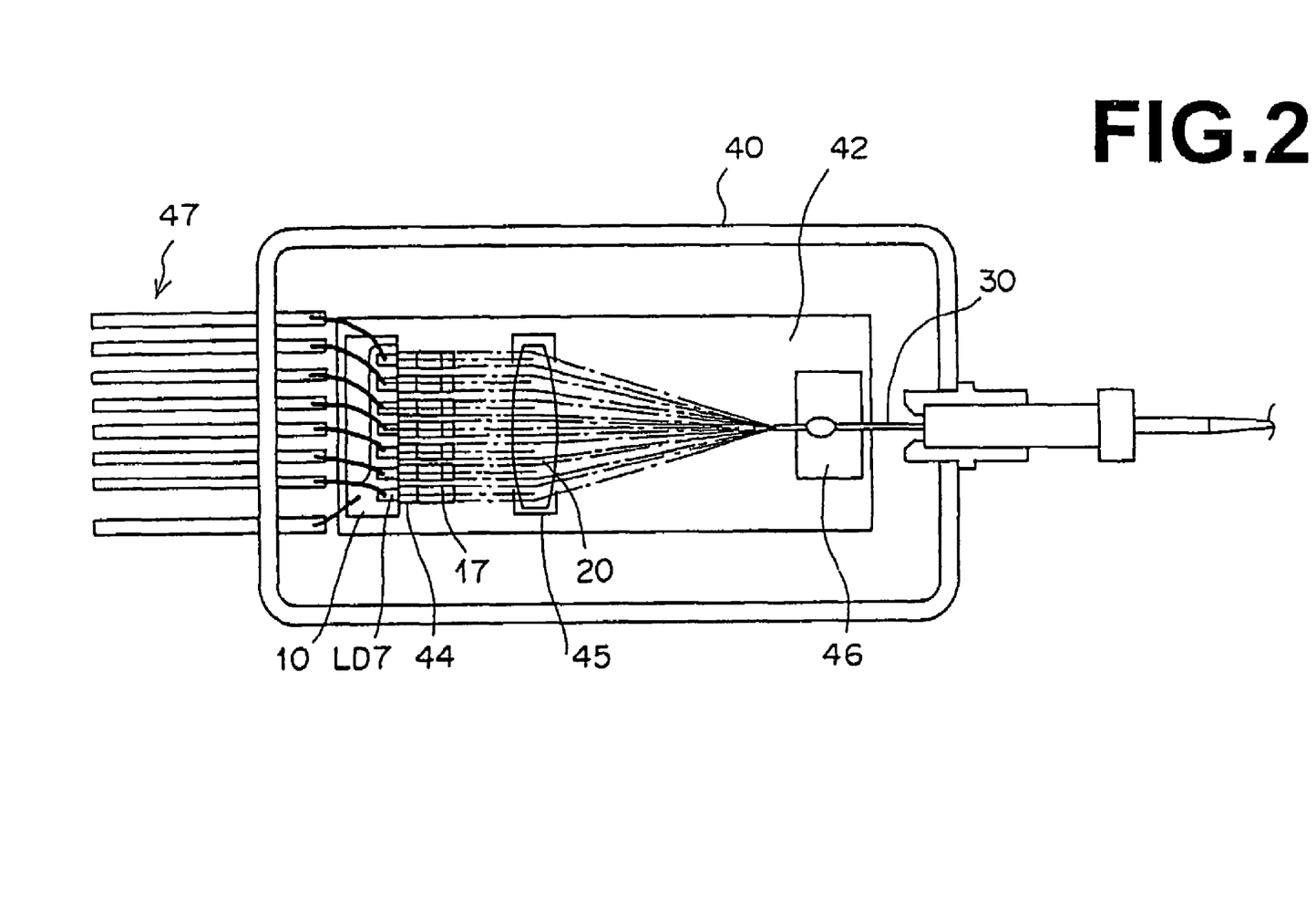
FIG. 2 is a top view of the laser module.
Figure 3:
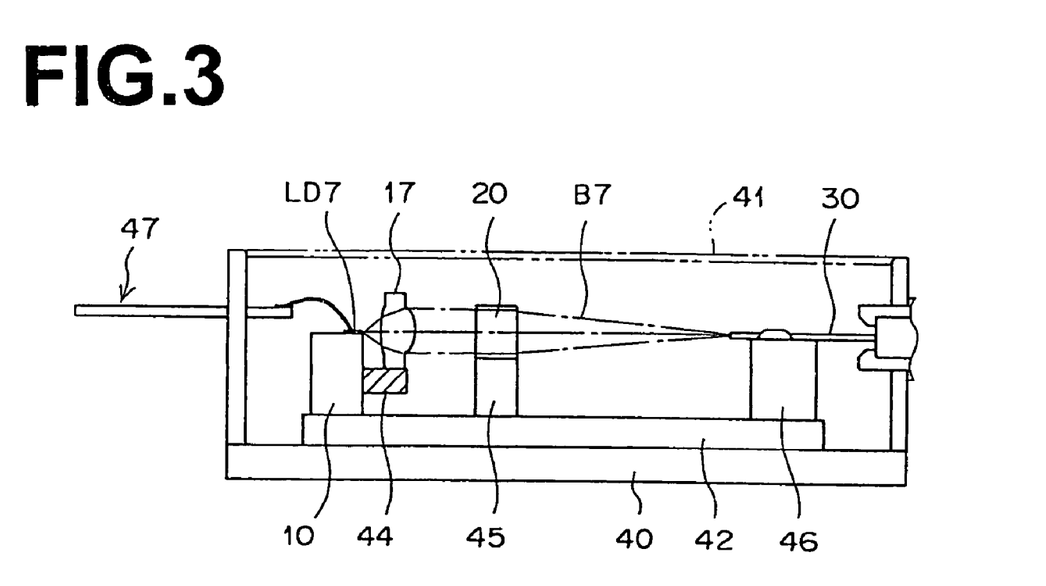
FIG. 3 is a side view of the laser module.

In a laser module in this embodiment, a combined-wave laser light source shown in FIG. 1 is mounted in a hermetically sealed container shown in FIGS. 2 and 3. The laser light source comprises a plurality (such as 7) of multi-transverse mode GaN semiconductor laser chips LD1~LD7 (hereinafter referred to as the laser chips LD1~LD7) laid out on a heat sink 10, collimating lenses 11~17 corresponding respectively to the laser chips LD1~LD7, a focusing lens 20, and a multi-mode optical fiber 30.

The laser chips LD1~LD7 have a common emission wavelength (such as 405 nm) and common maximal power (such as 100 mW). Any GaN semiconductor laser chips whose emission wavelength is other than 405 nm but ranges from 350 nm to 450 nm can be used for the laser chips LD1~LD7.

As shown in a top view and a side view in FIGS. 2 and 3, the laser light source is contained in a box-type enclosure 40 whose top face is open, together with other optical components. A platform 42 is fixed to the bottom face of the enclosure 40. The heat sink 10, a focusing lens holder 45 for holding the focusing lens 20, and a fiber support 46 for supporting the entrance end of the multi-mode optical fiber 30 are fixed on the upper side of the platform 42. A collimating lens holder 44 is attached to a side of the heat sink 10, for holding the collimating lenses 11~17. A side face of the enclosure 40 has openings through which wires 47 are lead to the outside of the enclosure 40 for supplying power to the laser chips LD1~LD7.

In FIG. 2, only the laser chip LD7 and the collimating lens 17 are labeled for the sake of simpler drawing.

Figure 4:
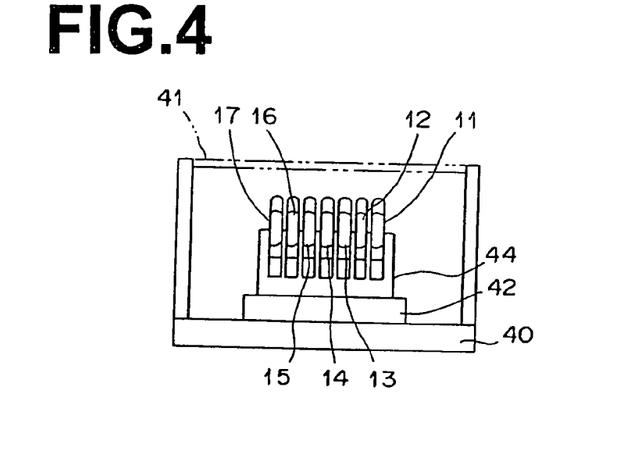
FIG. 4 is a partial side view of the laser module.

FIG. 4 shows a frontal view of how the collimating lenses 11~17 are held. Each of the collimating lenses 11~17 is formed to have an elongated shape generated by cutting an area including an optical axis of a circular lens having an aspheric surface by parallel planes. The collimating lenses 11~17 having the elongated shape are formed through molding of a resin or optical glass, for example. The collimating lenses 11~17 are closely laid out in the direction of alignment of emission points of the laser chips LD1~LD7 in such a manner that the direction of the length of the collimating lenses is perpendicular to the direction of alignment of the emission points (right-left direction in FIG. 4).

Each of the laser chips LD1~LD7 has an active layer whose emission width is 2 μm. The laser chips LD1~LD7 respectively emit laser lights B1~B7 in an emission angle of 10° to the direction parallel to the active layer, and in an emission angle of 30° to the direction perpendicular to the active layer, for example. The laser chips LD1~LD7 are aligned in such a manner that the emission points thereof are aligned in the direction parallel to the active layer.

Therefore, the laser lights B1~B7 emitted from the emission points enter the corresponding elongated collimating lenses 11~17 in such a manner that the direction of the larger emission angle agrees with the direction of the length of the corresponding collimating lenses while the direction of the smaller emission angle agrees with the direction of the width (that is, the direction perpendicular to the direction of the length) of the corresponding collimating lenses. More specifically, the width and the length of each of the collimating lenses are 1.1 mm and 4.6 mm, respectively, while the minor diameter of each of the laser lights B1~B7 in the horizontal direction and the major diameter thereof in the vertical direction are 0.9 mm and 2.6 mm, respectively. For each of the collimating lenses 11~17, a focal length $f_1$ is 3 mm and NA thereof is 0.6. The collimating lenses are laid out at 1.25 mm intervals.

The focusing lens 20 is formed to have an elongated shape generated by cutting an area of an aspheric circular lens including an optical axis by parallel planes. The shape of the focusing lens 20 is longer in the alignment direction of the collimating lenses 11~17 (that is, the horizontal direction) and shorter in the direction perpendicular to the alignment direction of the collimating lenses 11~17. A focal distance $f_2$ of the focusing lens 20 is 12.5 mm, and NA thereof is 0.3. The focusing lens 20 is also formed by molding a resin or optical glass, for example.

The multi-mode optical fiber 30 can be a step index optical fiber, a graded index optical fiber, or a multi-fiber cable. For example, a graded index optical fiber manufactured by MITSUBISHI CABLE INDUSTRIES, LTD. can be used preferably. This optical fiber adopts graded index in the core thereof, and adopts step index for the cladding thereof. The diameter of the core is 25 μm while NA is 0.3. Transmissivity of an end coating thereof is 99.5% or more.

The enclosure 40 has an enclosure cover 41 for closing the opening thereof. By closing the opening of the enclosure 40 with the cover 41 with introduction of a gas to be sealed therein after deairing processing that will be explained later, the laser light source is hermetically sealed with the other optical components in the closed space formed by the enclosure 40 and the cover 41.

Operation of the laser module will be explained next. The collimating lenses 11~17 collimate the corresponding laser lights B1~B7 emitted in the form of divergent lights from the laser chips LD1~LD7 of the laser light source. The collimated laser lights B1~B7 are focused by the focusing lens 20, and converges on the entrance end of a core 30a of the multi-mode optical fiber 30.

In this example, the collimating lenses 11~17 and the focusing lens 20 comprise a light-focusing optical system, and the light-focusing optical system and the multi-mode optical fiber 30 comprise a combined-wave optical system. More specifically, the laser lights B1~B7 focused by the focusing lens 20 in the above manner enter the core 30a of the multi-mode optical fiber 30 and propagate through the optical fiber 30. The laser lights B1~B7 are then combined and exit as a laser beam B from the optical fiber 30.

In the laser module described above, a coupling efficiency of the laser lights B1~B7 to the multi-mode optical fiber 30 is 0.9. Therefore, in the case where output power from each of the laser chips LD1~LD7 is 100 mW, the laser beam B has 630 mW power (=100 mW×0.9×7).

Next will be explained adhesion of the collimating lenses 11~17 to the collimating lens holder 44 as a fixture composed of a metal such as cupper. An adhesion surface (the bottom face in FIG. 3) of each of the collimating lenses 11~17 is adhered to an adhesion surface of the collimating lens holder 44, and adhesive compositions described below are inserted into gaps between the lenses and the holder. The adhesive compositions are then cured by irradiation of an ultraviolet ray. As an alicyclic epoxy compound, UVR-6128 (bis(3,4-epoxy cyclohexyl)adipate) obtained from UNION CARBIDE JAPAN KK is used. As a mono-functional oxetane compound, Aronoxetane OXT-212 (EHOX) manufactured by Toagosei Co., Ltd. is used. UVI 6990 ($PF_5$ salt of triaryl sulfonium) obtained from UNION CARBIDE JAPAN KK is used as a photo-initiator. A weight ratio of these components is formulated as shown in Table 1 below, for Examples 1 to 3 and Comparative Example 1.

TABLE 1

|  | Comparative Example | Example 1 | Example 2 | Example 3 |
|---|---|---|---|---|
| UVR-6128 | 100 | 90 | 80 | 70 |
| EHOX | 0 | 10 | 20 | 30 |
| UVI 6990 | 3 | 3 | 3 | 3 |
| Uniformity of Adhesion Surface after UV Irradiation | X | Δ | ◯ | ◎ |
| Contact Angle with Holder (°) | 52 | 38 | 28 | 26 |
| Contact Angle with Lens (°) | 36 | 25 | 17 | 17 |

After the adhesive compositions in Examples 1~4 are cured by an ultraviolet ray, adhesion uniformity is visually observed with use of an optical microscope. Adhesives having the adhesive compositions in Examples 1 to 3 using the oxetane compounds EHOX show superior uniformity on the adhesion surfaces than the adhesive in Comparative Example 1 that does not include the oxetane compound.

An amount of organic volatile gas generated from each of the adhesives is 90 μg/g at 150° C. when measured by GC/MS. This value is smaller than 100 μg/g that has been described above. An amount of generated organic volatile gas measured by GC/MS at 150° C. is 10 μg/g or less from each of the optical components such as the laser chips LD1~LD7, the collimating lenses 11~17, and the focusing lens 20 that are cemented in the enclosure 40 by an adhesive other than the adhesives above. Consequently, reduction in life of the laser chips LD1~LD7 caused by the organic volatile gas from the adhesives can be suppressed to an extremely small value in the laser module in this embodiment and the life of the module can be prolonged because of the reason described above in detail.

An example will be explained next wherein the collimating lenses 11~17 are cemented to the collimating lens holder 44 by other adhesive compositions. The adhesion surface (the bottom face in FIG. 3) of each of the collimating lenses 11~17 is placed on the adhesion surface of the collimating lens holder 44, and adhesive compositions described below are inserted into gaps between the lenses and the holder. The adhesive compositions are then cured by irradiation of an ultraviolet ray. As an alicyclic epoxy compound, UVR-6128 obtained from UNION CARBIDE JAPAN KK is used. In addition, as a difunctional glycidyl compound, bisphenol F type Epikote manufactured by Japan Epoxy Resins Co., Ltd is used upon necessity. As a mono-functional oxetane compound, Aronoxetane OXT-212 (EHOX) manufactured by Toagosei Co., Ltd. is used together. UVI 6990 ($PF_5$ salt of triaryl sulfonium) obtained from UNION CARBIDE JAPAN KK is used as a photo-initiator. KBM303 manufactured by Shin-Etsu Chemical Co., Ltd. as a silane coupling agent and synthetic quartz spherical silica 1-FX manufactured by Tatsumori Ltd. are used together upon necessity. The silica has an average grain size of 0.38 μm. A weight ratio of these components is formulated as shown in Table 2 below, for Examples 4 to 10.

TABLE 2

| | # of Examples | | | | | | |
|---|---|---|---|---|---|---|---|
| | 4 | 5 | 6 | 7 | 8 | 9 | 10 |
| UVR-6128 | 85 | 80 | 70 | 70 | 70 | 35 | 35 |
| Epikote806 | 0 | 0 | 0 | 0 | 0 | 35 | 35 |
| EHOX | 15 | 20 | 30 | 30 | 30 | 30 | 30 |
| UVI 6990 | 3 | 3 | 3 | 3 | 3 | 3 | 3 |
| KBM3O3 | 0 | 0 | 0 | 1 | 2 | 2 | 2 |
| 1-FX | 0 | 0 | 0 | 0 | 0 | 0 | 10 |
| Contact Angle with Holder (°) | 33 | 28 | 26 | 23 | 19 | 20 | 21 |
| Contact Angle with Lens (°) | 23 | 18 | 17 | 14 | 9 | 8 | 10 |
| Viscosity (mPa · s) | 250 | 190 | 100 | 100 | 100 | 105 | 150 |
| Adhesive Thickness (μm) | 0.4 | 0.4 | 0.4 | 0.4 | 0.3 | 0.4 | 0.4 |
| Separation Rate after −25° C.~70° C. Storage Test | 50% | 25% | 17% | 12% | 0% | 0% | 0% |

After the adhesive compositions are cured by an ultraviolet ray and storage test is carried out at −25~70° C., a rate of separation of the adhesion surfaces is measured. A result is shown in Table 2. The separation rate is lower for Examples 5 and 6 using the adhesive compositions including the mono-functional oxetane compound EHOX in higher concentration than Example 4. The separation rate is much lower for Examples 7 and 8 using the adhesive compositions including the silane coupling agent. Especially, in Example 8, no separation is observed. Example 9 uses the bisphenol F type glycidyl compound in addition to the alicyclic epoxy compound, and Example 10 uses the synthetic quartz spherical silica. In either case, no separation of an adhesion layer is observed on the collimating lens holder 44 after forcible storage test carried out thereon.

A layer thickness of each of adhesives comprising the adhesive compositions in Examples 4 to 10 is measured between the collimating lens holder 44 and the collimating lenses 11~17 after the adhesive compositions are cured by an ultraviolet ray. The thickness ranges approximately from 0.3 to 0.6 μm. A rate of volume contraction of the adhesives caused by the curing thereof ranges from 4 to 5%, and a change in the adhesion layer thickness after the storage test at −25~70° C. is 0.03 μm or less. Therefore, relative positions between the laser chips LD1~LD7, which have been subjected to optical axis adjustment, and the collimating lenses 11~17 are not changed by the adhesion, resulting in a preferable effect of combining the laser lights.

In this examination, an amount of organic volatile gas generated from each of the adhesives including the adhesive compositions described above is also 90 μg/g at 150° C. when measured by GC/MS. This value is lower than 100 μg/g described above. An amount of generated organic volatile gas measured by GC/MS at 150° C. is 10 μg/g or less from each of the optical components such as the laser chips LD1~LD7, the collimating lenses 11~17, and the focusing lens 20 that are cemented in the enclosure 40 by an adhesive other than the adhesives above. Consequently, reduction in life of the laser chips LD1~LD7 caused by the organic volatile gas generated from the adhesives in this examination can be suppressed to an extremely small value and life of the laser module can thus be prolonged.

The adhesive compositions used for adhesion of the collimating lenses 11~17 to the collimating lens holder 44 can be used for adhesion of the other optical components in the enclosure 40 to a fixture. For example, the adhesive compositions can be applied to cementing the focusing lens 20 and the focusing lens holder 45, and to cementing the multi-mode fiber 30 and the fiber support 46. In this case, the same effect as described above can be obtained.

Furthermore, the adhesive compositions described above can widely be applied to adhesion of optical components and a fixture in a laser module generally comprising a light source, a lens, a mirror, a half mirror, a convex mirror, a concave mirror, and a diffraction grating, in addition to the laser module shown in FIGS. 1 to 4. In this case, the same effect can also be obtained.

What is claimed is:

1. A laser module having a semiconductor laser device whose emission wavelength is 350~450 nm, the semiconductor laser device being contained in a hermetically sealed container, wherein
    each optical component in the container, including the semiconductor laser device, generates an organic volatile gas of 10 μg/g or less when examined by GC/MS (Gas Chromatography/Mass Spectrometry) at 150° C.,
    an organic adhesive used for fixing the optical components in the container generates an organic volatile gas of 100 μg/g or less when examined by GC/MS at 150° C., and
    the unit μg/g is an amount of volatile organic substances (in μg) per an amount of a volatile gas of hexadecane (in g).

2. The laser module according to claim 1, wherein the organic adhesive contains an adhesive composition including an alicyclic epoxy compound having an epoxy group, a compound having an oxetanyl group, and a catalyst quantity of an onium salt photo-initiator.

3. The laser module according to claim 2, wherein the optical components are fixed on a fixture to fix the optical components thereon, by insertion of the adhesive composition between the optical components and the fixture in a thickness ranging from 0.05 μm to 5 μm followed by curing of the adhesive composition by an activation light.

4. The laser module according to claim 2, wherein the adhesive composition includes a silane coupling agent.

5. The laser module according to claim 2, wherein the adhesive composition includes spherical silica particles whose average diameter ranges from 0.1 to 1.0 μm.

6. The laser module according to claim 2, wherein the fixture is composed of a metal and the optical components are composed of an inorganic transparent material.

7. The laser module according to claim 2, wherein the compound including an oxetanyl group has the formula (1):

wherein $R_1$ represents a methyl group or an ethyl group and $R_2$ represents a hydrocarbon group including 6 to 12 carbon atoms.

8. The laser module according to claim 1, wherein the optical components includes an optical fiber and an optical system for inputting a laser light emitted from the semiconductor laser device to the optical fiber.

9. The laser module according to claim 8, wherein the organic adhesive contains an adhesive composition including an alicyclic epoxy compound having an epoxy group, a compound having an oxetanyl group, and a catalyst quantity of an onium salt photo-initiator.

10. The laser module according to claim 9, wherein the optical components are fixed on a fixture to fix the optical components thereon, by insertion of the adhesive composition between the optical components and the fixture in a thickness ranging from 0.05 µm to 5 µm followed by curing of the adhesive composition by an activation light.

11. The laser module according to claim 9, wherein the adhesive composition includes a silane coupling agent.

12. The laser module according to claim 9, wherein the adhesive composition includes spherical silica particles whose average diameter ranges from 0.1 to 1.0 µm.

13. The laser module according to claim 9, wherein the fixture is composed of a metal and the optical components are composed of an inorganic transparent material.

14. The laser module according to claim 9, wherein the compound including an oxetanyl group has the formula (1):

(1)

wherein $R_1$ represents a methyl group or an ethyl group and $R_2$ represents a hydrocarbon group including 6 to 12 carbon atoms.

* * * * *